United States Patent
Uchida et al.

(10) Patent No.: US 11,410,871 B2
(45) Date of Patent: Aug. 9, 2022

(54) WORKPIECE PLACEMENT APPARATUS AND PROCESSING APPARATUS

(71) Applicant: Tokyo Electron Limited, Tokyo (JP)

(72) Inventors: Yohei Uchida, Miyagi (JP); Naoki Sugawa, Miyagi (JP); Katsushi Abe, Miyagi (JP); Tsuyoshi Hida, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 138 days.

(21) Appl. No.: 16/293,788

(22) Filed: Mar. 6, 2019

(65) Prior Publication Data

US 2019/0279894 A1 Sep. 12, 2019

(30) Foreign Application Priority Data

Mar. 7, 2018 (JP) .............................. JP2018-041231

(51) Int. Cl.
*H01L 21/687* (2006.01)
*H01J 37/32* (2006.01)
*H01L 21/67* (2006.01)
*H01L 21/683* (2006.01)

(52) U.S. Cl.
CPC .. *H01L 21/68735* (2013.01); *H01J 37/32715* (2013.01); *H01L 21/67069* (2013.01); *H01L 21/67109* (2013.01); *H01L 21/67126* (2013.01); *H01L 21/6831* (2013.01); *H01L 21/68785* (2013.01)

(58) Field of Classification Search
CPC ......... H01L 21/67069; H01L 21/67109; H01L 21/67126; H01L 21/6831; H01L 21/68785; H01L 21/68735; H01J 37/32715
See application file for complete search history.

(56) References Cited

U.S. PATENT DOCUMENTS

| | | | |
|---|---|---|---|
| 7,572,737 B1 | 8/2009 | Dhindsa | |
| 9,412,579 B2 | 8/2016 | Sadjadi et al. | |
| 9,536,711 B2 | 1/2017 | Dhindsa et al. | |
| 2002/0069971 A1* | 6/2002 | Kaji | H01J 37/32623 156/345.46 |
| 2004/0053428 A1* | 3/2004 | Steger | H01J 37/32623 438/10 |
| 2007/0215279 A1* | 9/2007 | Koshiishi | H01J 37/32642 156/345.3 |

(Continued)

FOREIGN PATENT DOCUMENTS

| | | |
|---|---|---|
| JP | 2004-079820 | 3/2004 |
| JP | 2006-080375 | 3/2006 |

(Continued)

*Primary Examiner* — Keath T Chen
*Assistant Examiner* — Margaret D Klunk
(74) *Attorney, Agent, or Firm* — IPUSA, PLLC

(57) ABSTRACT

A placement apparatus for placing a workpiece is provided. The placement apparatus includes a stage on which a workpiece can be placed in a processing vessel; an edge ring including a locking part which is disposed on the stage so as to surround a periphery of the workpiece; a conductive connecting member connected with the edge ring at the locking part; and a first contacting member configured to cause the edge ring to contact the stage, while the edge ring is connected with the connecting member.

9 Claims, 10 Drawing Sheets

(56) References Cited

U.S. PATENT DOCUMENTS

| | | | |
|---|---|---|---|
| 2011/0021031 A1* | 1/2011 | Taylor | H01J 37/32467 438/724 |
| 2012/0061351 A1* | 3/2012 | Ohata | H01J 37/32091 216/67 |
| 2014/0273483 A1* | 9/2014 | Ge | H01J 37/32651 438/710 |
| 2018/0315640 A1* | 11/2018 | Ueda | H01J 37/32513 |

FOREIGN PATENT DOCUMENTS

| | | |
|---|---|---|
| JP | 2006-245510 | 9/2006 |
| JP | 2014-007215 | 1/2014 |
| WO | 2003/009363 | 1/2003 |

* cited by examiner

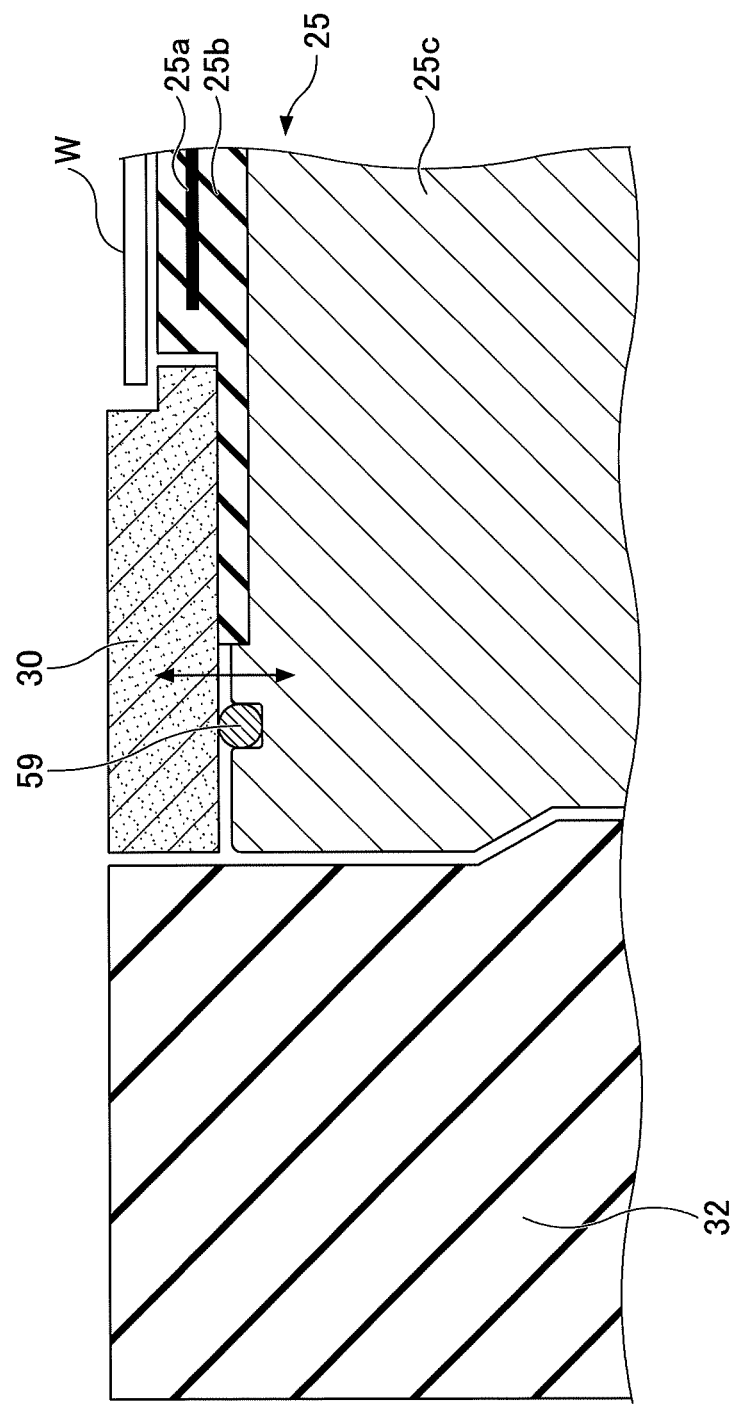

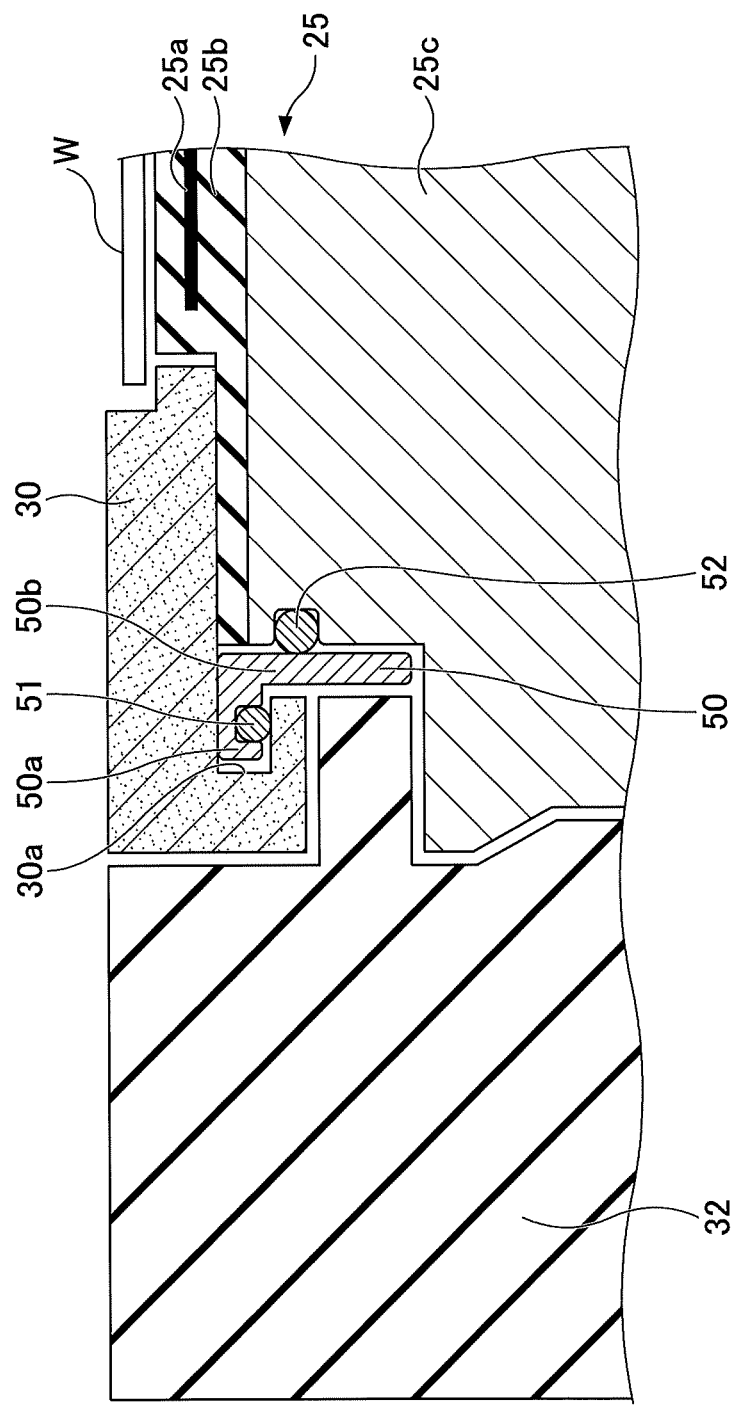

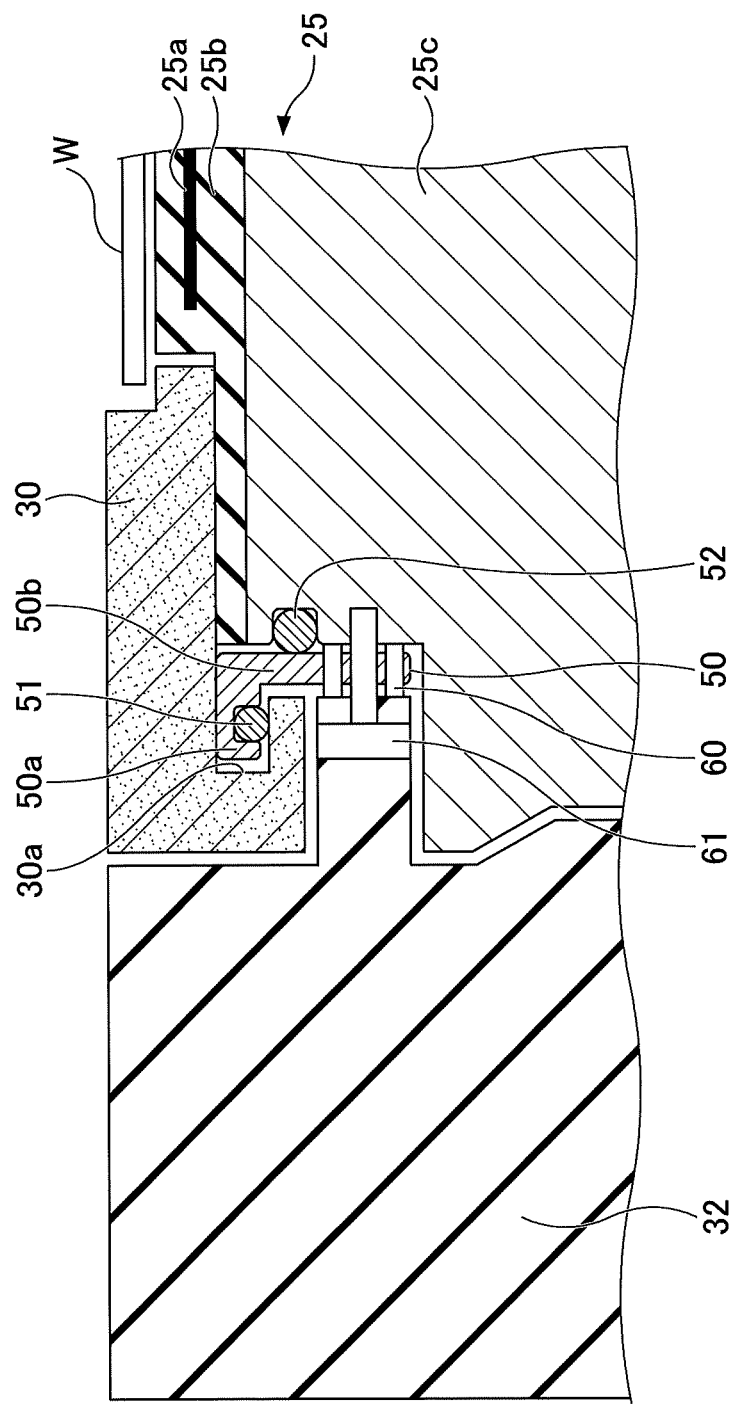

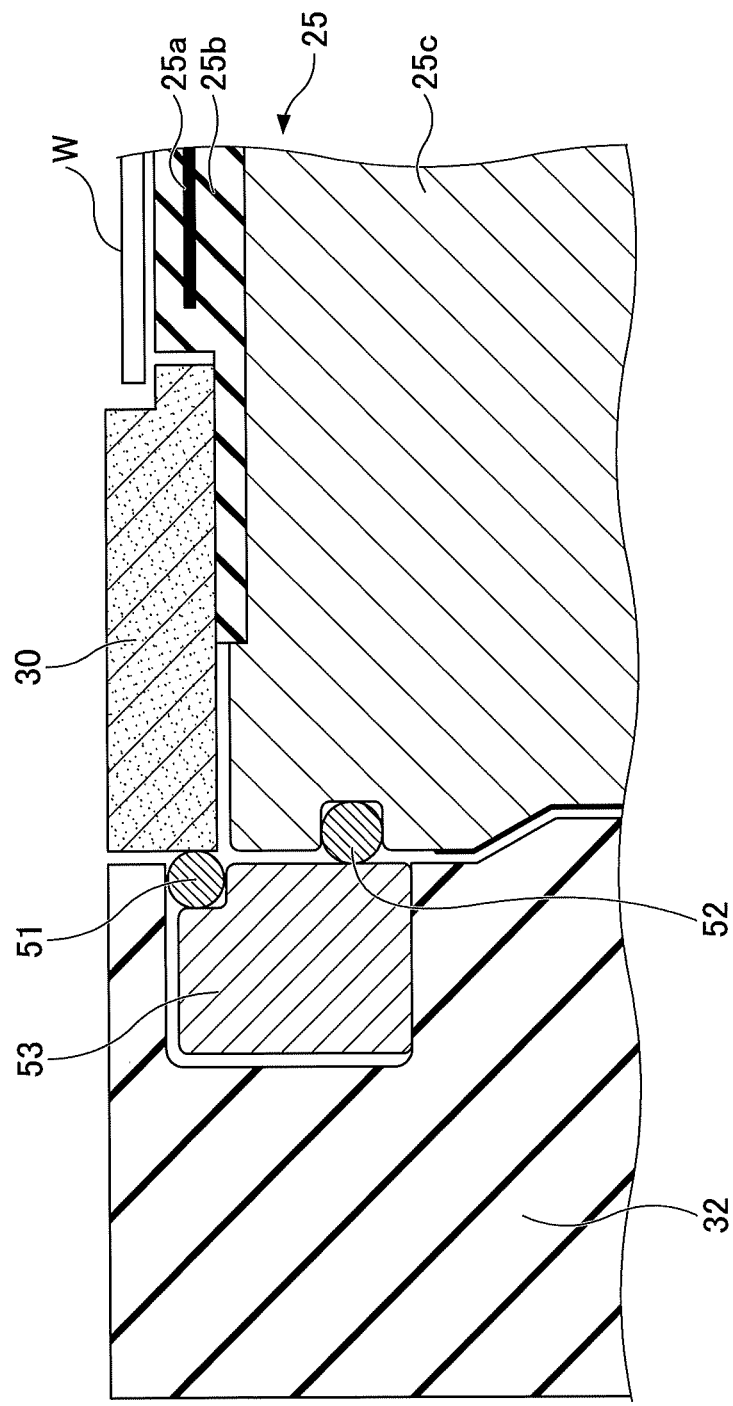

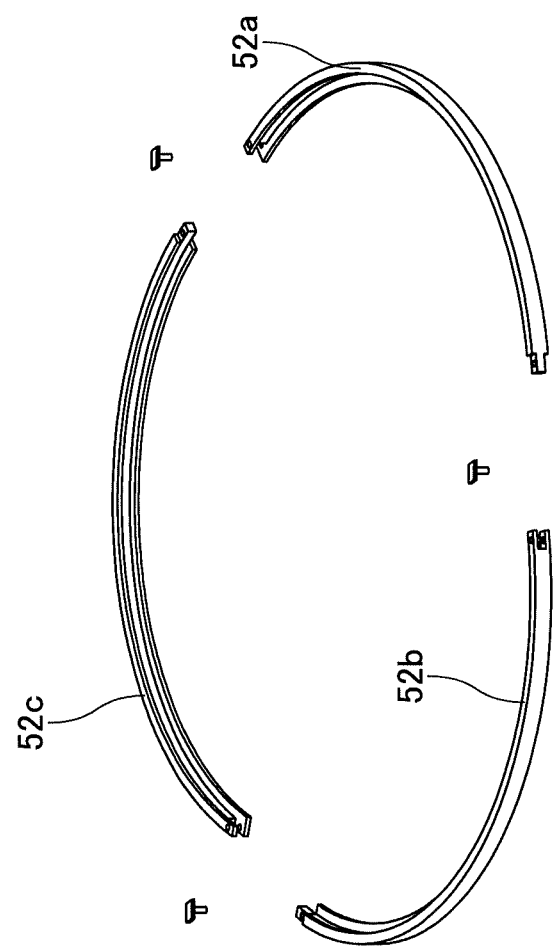

WORKPIECE PLACEMENT APPARATUS AND PROCESSING APPARATUS

CROSS-REFERENCE TO RELATED APPLICATIONS

This patent application is based on and claims priority to Japanese Patent Application No. 2018-041231 filed on Mar. 7, 2018, the entire contents of which are incorporated herein by reference.

BACKGROUND OF THE INVENTION

1. Field of the Invention

The present invention generally relates to a workpiece placement apparatus and a processing apparatus.

2. Description of the Related Art

In a processing chamber of a processing apparatus, an edge ring is disposed on a stage so as to surround a periphery of a wafer, in order to direct plasma toward a surface of the wafer. During plasma processing, as the edge ring is exposed to plasma, the edge ring becomes worn.

As a result, because a level difference may occur to with respect a sheath generated on an edge ring and a sheath generated on a wafer and an incident angle of ions may be tilted at an edge of the wafer, tilting may occur on an etching profile. Also, as an etching rate at the edge of the wafer may vary, an etching rate in a wafer may become uneven. Accordingly, when an edge ring is worn to a certain amount, the edge ring is replaced with a new one. However, a time for replacing an edge ring is one of factors degrading productivity.

In order to alleviate the problem, a technique for controlling distribution of an etching rate of a surface by applying DC (direct current) voltage to an edge ring from a DC power source has been proposed (see Patent Documents 1 to 7, for example).

When DC voltage is applied to an edge ring, it is important that the edge ring is stably in contact with a base member of a stage on which the edge ring is placed. By the edge ring being in contact with the base member stably, electric potential of the edge ring becomes equal to electric potential of the base member, and a thickness of a sheath on the edge ring can be controlled precisely.

CITATION LIST

Patent Document

[Patent Document 1] Japanese Laid-open Patent Application Publication No. 2014-007215
[Patent Document 2] U.S. Pat. No. 7,572,737
[Patent Document 3] U.S. Pat. No. 9,536,711
[Patent Document 4] U.S. Pat. No. 9,412,579
[Patent Document 5] Japanese Laid-open Patent Application Publication No. 2004-079820
[Patent Document 6] Japanese Laid-open Patent Application Publication No. 2006-080375
[Patent Document 7] Japanese Laid-open Patent Application Publication No. 2006-245510

SUMMARY OF THE INVENTION

According to an aspect of the present invention, a placement apparatus for placing a workpiece is provided. The placement apparatus includes a stage on which a workpiece can be placed in a processing vessel; an edge ring including a locking part which is disposed on the stage so as to surround a periphery of the workpiece; a conductive connecting member connected with the edge ring at the locking part; and a first contacting member configured to cause the edge ring to contact the stage, while the edge ring is connected with the connecting member.

BRIEF DESCRIPTION OF THE DRAWINGS

FIG. 3A and FIG. 3B are diagrams illustrating a problem caused by an applied force and by thermal expansion at a contacting part;
FIG. 4A and FIG. 4B are diagrams illustrating examples of contacting structures of an edge ring and a stage according to a first embodiment;
FIG. 5 is a diagram illustrating an example of a contacting structure of the edge ring and the stage according to a second embodiment;
FIG. 6B is a diagram illustrating an example of a second contacting part.

DETAILED DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

[Processing Apparatus]

Figure 1:
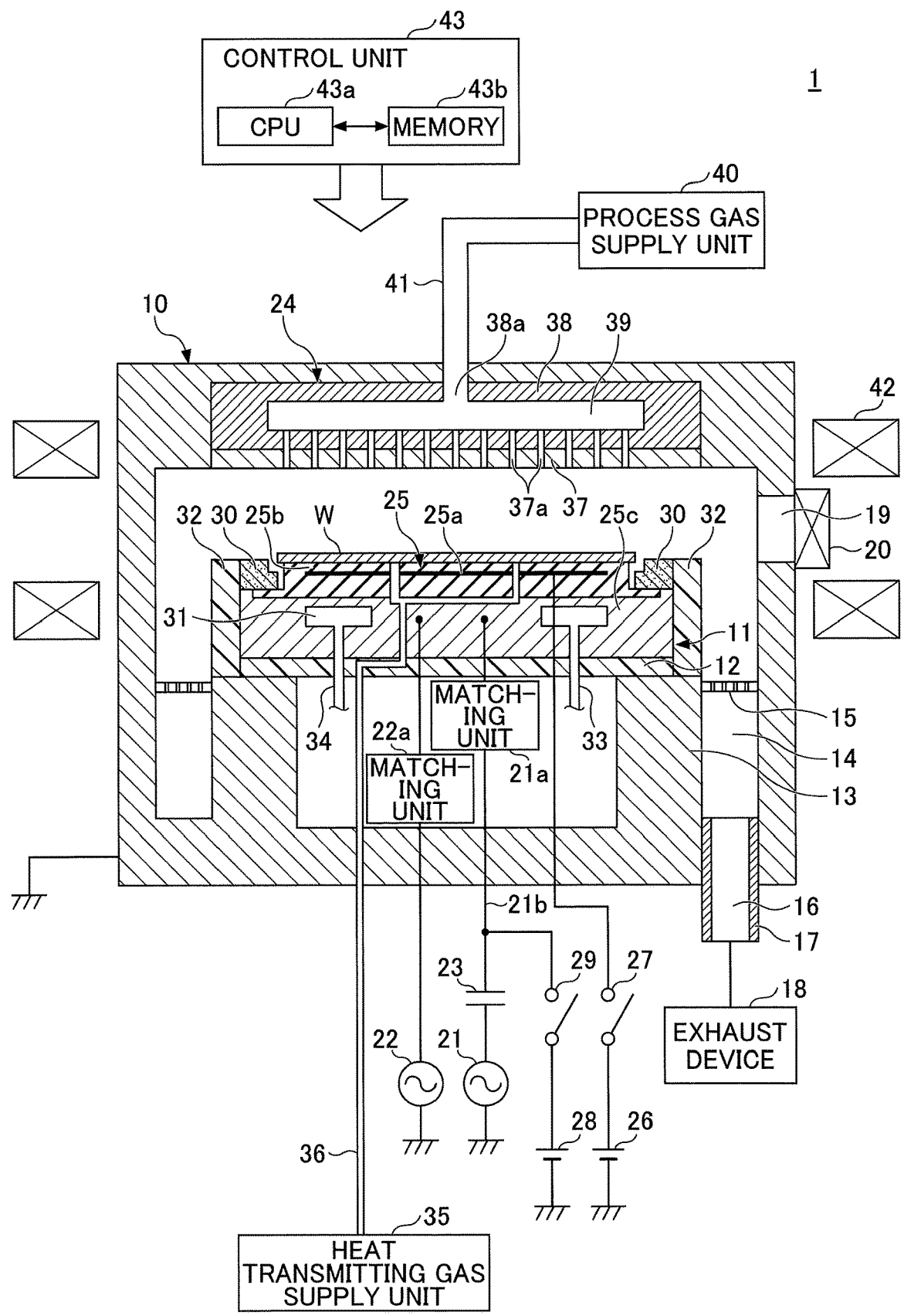
FIG. 1 is a diagram illustrating an example of a processing apparatus according to the present disclosure.

First, an example of a processing apparatus 1 according to the present disclosure will be described with reference to FIG. 1. FIG. 1 is a diagram illustrating a cross section of the processing apparatus 1 according to the present disclosure. The processing apparatus 1 according to the present disclosure is a processing apparatus of a reactive ion etching (RIE) type.

The processing apparatus 1 includes a cylindrical processing vessel 10 formed of metal, such as aluminum or stainless steel. The inside of the processing vessel 10 is a processing chamber for performing a plasma process such as plasma etching or plasma CVD. The processing vessel 10 forms a processing space for applying a process to a semiconductor wafer W which is an example of a workpiece (hereinafter, a semiconductor wafer W may also be referred to as a "wafer W"). The processing vessel 10 is grounded.

A disc shaped stage 11 is provided in the processing vessel 10. The stage 11 is used for placing a wafer W. The stage 11 includes an electrostatic chuck 25. The stage 11 is supported by a cylindrical supporting member 13 that extends upward from the bottom of the processing vessel 10, via a cylindrical holding member 12 formed of aluminum oxide ($Al_2O_3$).

The electrostatic chuck 25 includes a base 25c formed of aluminum, and a dielectric layer 25b disposed on the base 25c. An attracting electrode 25a made from conductive film is embedded in the dielectric layer 25b. A direct current (DC) power source 26 is connected to the attracting electrode 25a via a switch 27. The electrostatic chuck 25 generates electrostatic force (Coulomb force) by DC voltage applied from the DC power source 26 to the attracting electrode 25a, and a wafer W is attracted to and held by the electrostatic chuck 25 by the generated electrostatic force.

At outer circumferences of the electrostatic chuck 25 and the wafer W on the base 25c, an edge ring 30 is disposed. The edge ring 30 is made from Si or SiC. An outer circumference of the electrostatic chuck 25 and an outer circumference of the edge ring 30 are covered by an insulator ring 32.

A first high frequency power source 21 is connected to the stage 11 via a matching unit 21a. The first high frequency power source 21 supplies, to the stage 11, high frequency electric power of a first frequency (such as a frequency of 13 MHz) for generating plasma or for RIE (hereinafter, the high frequency electric power of the first frequency may also be referred to as "first high frequency electric power"). Also, a second high frequency power source 22 is connected to the stage 11 via a matching unit 22a. The second high frequency power source 22 supplies high frequency electric power of a second frequency lower than the first frequency (such as a frequency of 3 MHz) for generating bias voltage (hereinafter, the high frequency electric power of the second frequency may also be referred to as "second high frequency electric power"). Thus, the stage 11 also functions as a lower electrode.

A variable DC power source 28 is connected to an electric wire 21b via a switch 29. A blocking capacitor 23 is provided between a connection point of the variable DC power source 28 on the electric wire 21b and the first high frequency power source 21. The blocking capacitor 23 is used to block DC voltage applied from the variable DC power source 28, so that DC voltage is not applied to the first high frequency power source 21. By the DC voltage applied from the variable DC power source 28, voltage is applied to the edge ring 30.

In the base 25c, a coolant chamber 31 of an annular shape, which extends in a circumferential direction, is provided. From a chiller unit, coolant at a predetermined temperature, such as cooling water, is supplied to the coolant chamber 31, and the coolant circulates in the coolant chamber 31 via pipes 33 and 34, in order to cool the electrostatic chuck 25 and the wafer W.

To the electrostatic chuck 25, a heat transmitting gas supply unit 35 is connected via a gas supply line 36. The heat transmitting gas supply unit 35 supplies heat transmitting gas to a space between the upper surface of the electrostatic chuck 25 and a bottom surface of the wafer W. Gas having good heat conductivity, such as He gas, may preferably be used as a heat transmitting gas.

Between a side wall of the processing vessel 10 and the cylindrical supporting member 13, an exhaust path 14 is formed. At an entrance of the exhaust path 14, an annular baffle plate 15 is provided. At a bottom of the exhaust path 14, an exhaust port 16 is provided. An exhaust device 18 is connected to the exhaust port 16 via an exhaust pipe 17. The exhaust device 18 includes a vacuum pump, and can reduce pressure of a processing space in the processing vessel 10 to a desirable quality of vacuum. Also, the exhaust pipe 17 includes an automatic pressure control valve (hereinafter referred to as an "APC") of a variable butterfly valve. The APC automatically controls pressure in the processing vessel 10. Further, a gate valve 20 is provided at the side wall of the processing vessel 10, which is used for opening and/or closing a loading/unloading port 19 for the wafer W.

A gas shower head 24 is mounted to a ceiling of the processing vessel 10. The gas shower head 24 includes an electrode plate 37, and an electrode supporting member 38 that detachably supports the electrode plate 37. The electrode plate 37 includes a large number of gas holes 37a. A buffer chamber 39 is provided in the electrode supporting member 38. The buffer chamber 39 includes a gas inlet port 38a, and a process gas supply unit 40 is connected to the gas inlet port 38a via a gas supplying pipe 41. Further, at a periphery of the processing vessel 10, annular magnets 42 are provided coaxially.

Each component of the processing apparatus 1 is connected to a control unit 43. The control unit 43 controls each of the components of the processing apparatus 1. Examples of the component include the exhaust device 18, the matching units 21a and 22a, the first high frequency power source 21, the second high frequency power source 22, the switches 27 and 29, the DC power source 26, the variable DC power source 28, the heat transmitting gas supply unit 35, and the process gas supply unit 40.

The control unit 43 includes a CPU 43a and a memory 43b. The CPU 43a reads out a control program for the processing apparatus 1 and a process recipe that are stored in the memory 43b, and executes the control program and the process recipe to cause the processing apparatus 1 to perform a predetermined process such as etching.

For example, when an etching process is performed in the processing apparatus 1, the gate valve 20 is opened first. Next, a wafer W is loaded into the processing vessel 10 and placed on the electrostatic chuck 25. Subsequently, DC voltage from the DC power source 26 is applied to the attracting electrode 25a to attract the wafer W to the electrostatic chuck 25, and DC voltage output from the variable DC power source 28 is applied to the base 25c, to apply DC voltage to the edge ring 30. Also, heat transmitting gas is supplied to the space between the electrostatic chuck 25 and the wafer W. Next, process gas is introduced inside the processing vessel 10, and pressure in the processing vessel 10 is reduced by the exhaust device 18 and the like. Further, first high frequency electric power and second high frequency electric power are supplied to the stage 11 from the first high frequency power source 21 and the second high frequency power source 22 respectively.

In the processing vessel 10 of the processing apparatus 1, a magnetic field of a horizontal direction is created by the magnets 42, and an RF electric field of a vertical direction is generated by high frequency electric power applied to the stage 11. Because of the generated magnetic field and the generated electric field, the process gas discharged from the gas shower head 24 is changed to plasma, and a given plasma process is applied to the wafer W by radicals or ions in the plasma.

[Abrasion of Edge Ring]

Figure 2A:
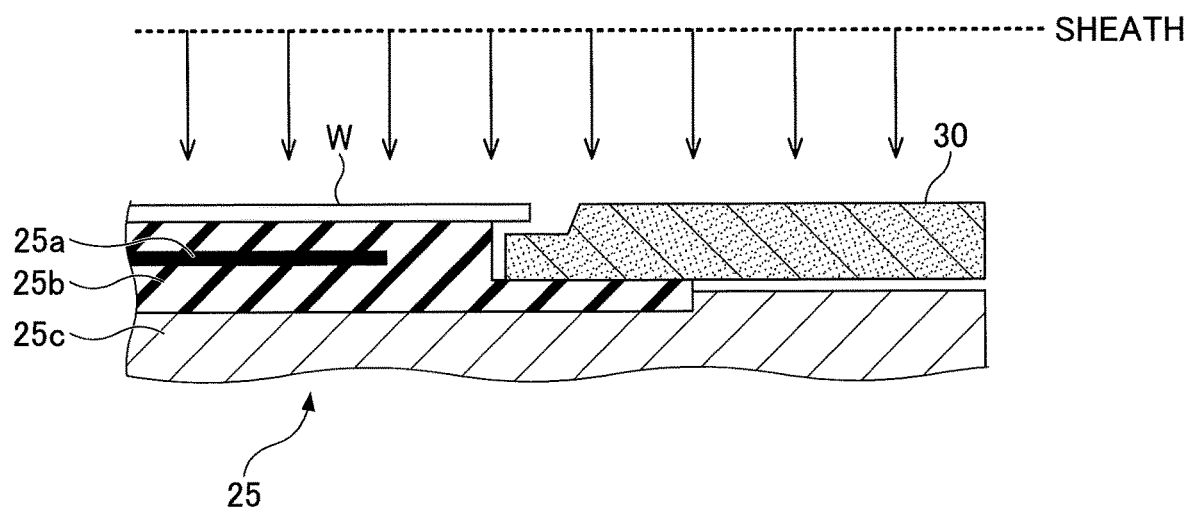
FIG. 2A and FIG. 2B are diagrams illustrating a variation of an etching rate and occurrence of tilting that are caused by abrasion of an edge ring.
Figure 2B:
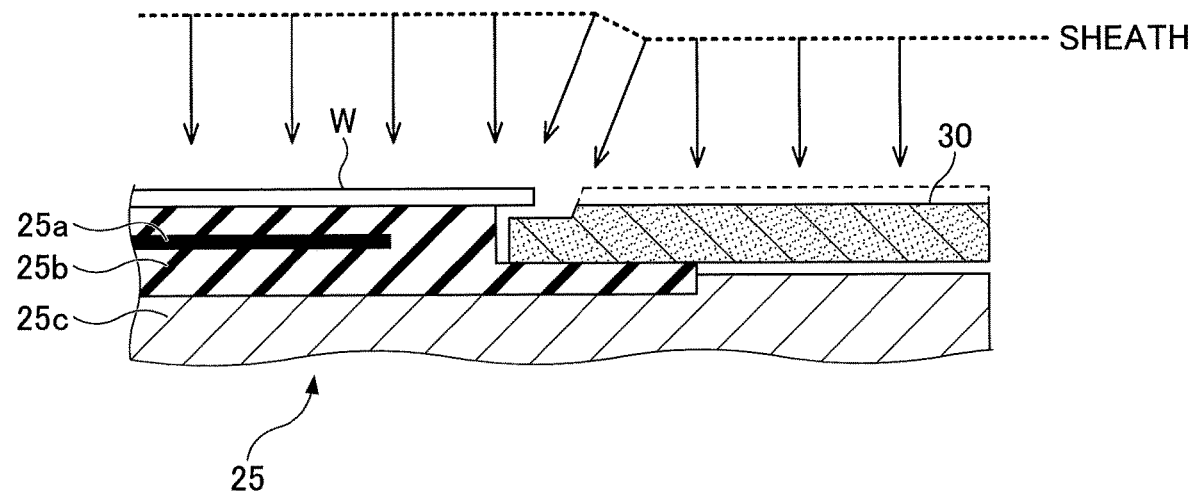

Next, a change of sheath, a variation of an etching rate, and occurrence of tilting, which are caused by abrasion of the edge ring 30, will be described with reference to FIGS. 2A and 2B. As illustrated in FIG. 2A, a thickness of the edge ring 30 is designed such that an upper surface of a wafer W and an upper surface of the edge ring 30 are at the same height, when the edge ring 30 is new. In such a state, during plasma processing, the sheath above the wafer W and the sheath above the edge ring 30 are at the same height, and an incident angle of ions from plasma above the wafer W and the edge ring 30 is vertical. As a result, an etching profile of a hole or the like formed on the wafer W becomes vertical, and an etching rate becomes uniform on an entire surface of the wafer W.

However, by the plasma processing being performed, as the edge ring 30 is exposed to plasma, the edge ring 30 abrades. Thus, as illustrated in FIG. 2B, because the height of the upper surface of the edge ring 30 becomes lower than the height of the upper surface of the wafer W, the sheath above the edge ring 30 becomes lower than the sheath above the wafer W in height.

At an edge of the wafer W in which a height difference of sheath occurs, an incident angle of ions becomes slanted, and tilting may occur in an etching profile. In addition, an etching rate at the edge of the wafer W varies, and the etching rate may become uneven on the surface of the wafer W.

However, in the processing apparatus 1 according to the present disclosure, as DC voltage output from the variable DC power source 28 is applied to the edge ring 30 to control thickness of a sheath, a sheath above the wafer W and a sheath above the edge ring 30 can be made to be at the same height during plasma processing. Accordingly, distribution of an etching rate on a surface and tilting can be controlled.

Figure 3B:
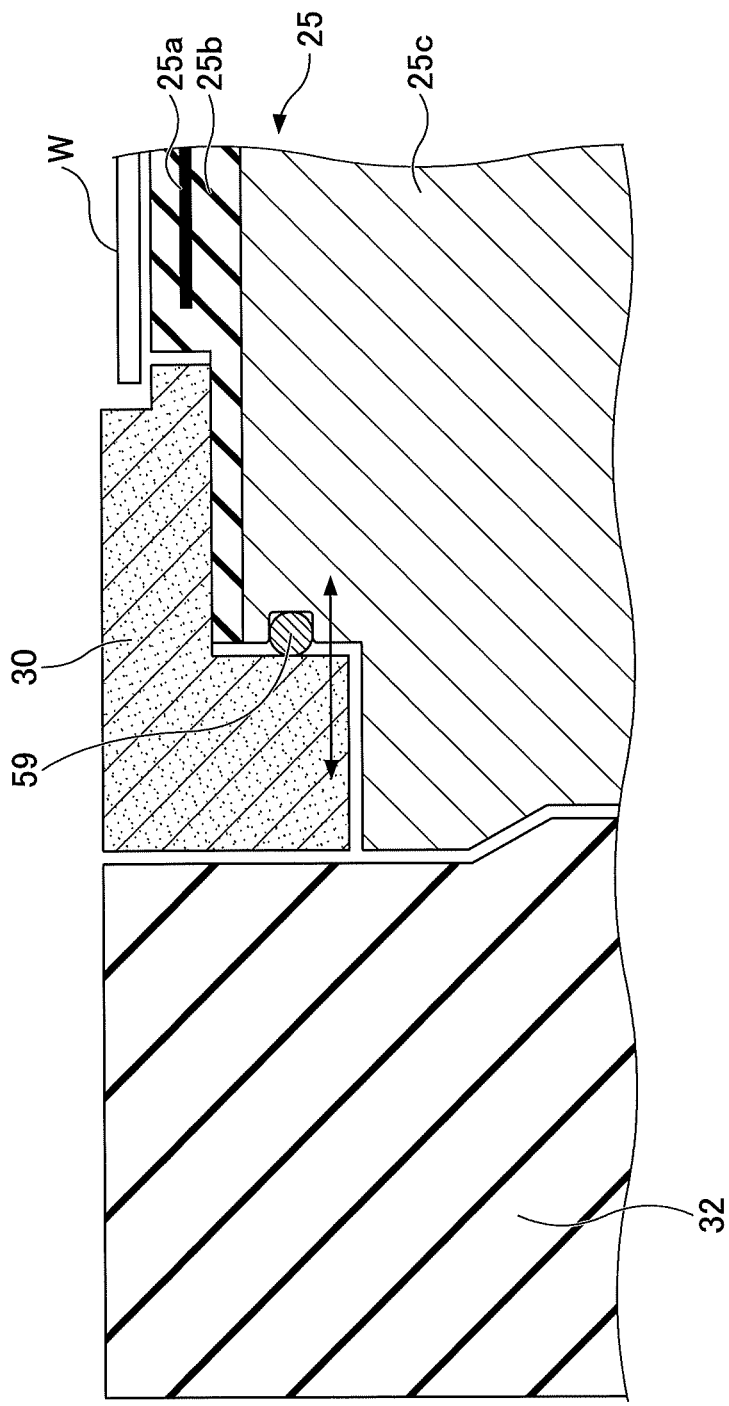

When DC voltage is applied to the edge ring 30, it is important that the edge ring 30 and the base member 25c are stably maintained at the same electric potential. Thus, one conceivable structure is that an elastic spiral tube 59 of a conductive material is disposed on the upper surface of the base member 25c, as illustrated in FIG. 3A, in order to cause the edge ring 30 to contact the base 25c.

However, in this structure, because of elastic force of the spiral tube 59, the edge ring 30 may be lifted and may depart from the base member 25c. Thus, in this structure, DC voltage applied to the base member 25c is not conducted to the edge ring 30 sufficiently, and it is difficult to maintain the edge ring 30 and the base member 25c at the same electric potential.

Another conceivable structure is that an edge ring 30 having an L-shaped cross section is used and that a spiral tube 59 is provided between a side wall of the edge ring 30 and a side wall of the base member 25c such that the spiral tube 59 is pressed to the edge ring 30 by the base member 25c. However, in this structure, because the edge ring 30 and the base member 25c may be made from different materials, an amount of thermal expansion (or an amount of thermal contraction) of the edge ring 30 in a radial direction may become different from an amount of thermal expansion (or an amount of thermal contraction) of the base member 25c in a radial direction, if temperature of the electrostatic chuck 25 is changed in accordance with process conditions. Because of the difference of an amount of thermal expansion (or contraction) of each of the members (the edge ring 30 and the base member 25c), a case may occur in which the spiral tube 59 does not contact the edge ring 30. Therefore, in this structure, DC voltage applied to the base member 25c is not conducted to the edge ring 30 sufficiently, and it is difficult to maintain the edge ring 30 and the base member 25c at the same electric potential.

The above described phenomenon that the edge ring 30 departs from the base member 25c occurs because of size differences of members of the processing apparatus 1 (such as the edge ring 30 and the base member 25c), or because of a difference of an amount of thermal expansion (or contraction) of each of the members caused by heat from plasma. It is difficult to eliminate the size differences of the members, or the difference of an amount of thermal expansion (or contraction) of each of the members.

Thus, in the present disclosure, the processing apparatus 1 having a structure in which the edge ring 30 is stably in contact with the stage 11 is provided. In the following, contacting structures according to a first to third embodiments will be described with reference to FIGS. 4A to 6B.

First Embodiment

[Contacting Structure of Edge Ring and Stage]

First, an example of a contacting structure of the edge ring 30 and the stage 11 according to a first embodiment will be described with reference to FIG. 4A and FIG. 4B. Note that, in the present disclosure, a structure of the edge ring 30 and the stage 11 (specifically, the base member 25c of the stage 11) in which the edge ring 30 and the stage 11 are connected with each other in a conductive state is referred to as a "contacting structure". Also, a state in which the edge ring 30 is (directly or indirectly) connected with the stage 11 in a conductive state is referred to as "contact". FIG. 4A is a diagram illustrating an example of a contacting structure of the edge ring 30 and the stage 11 according to the first embodiment. FIG. 4B is a diagram illustrating an example of a contacting structure of the edge ring 30 and the stage 11 according to a modified example of the first embodiment. First, the contacting structure according to the first embodiment will be described.

As illustrated in FIG. 4A, a locking part 30a is formed in the edge ring 30 according to the first embodiment. The locking part 30a is a recess provided at a position close to an outer circumference of the edge ring 30. An opening of the recess (locking part 30a) faces a center axis of the edge ring 30, and the recess is formed toward an outer circumference of the edge ring 30. The locking part 30a (recess) is provided along an entire circumference of the edge ring 30.

In the first embodiment, a placement apparatus (including the stage 11 and the edge ring 30) includes a first contacting member 51, a conductive connecting member 50, and a second contacting member 52. In the locking part 30a, the first contacting member 51 pushes the edge ring 30 toward the base member 25c, while the edge ring 30 is caused to be connected with the connecting member (specifically, the edge ring 30 is pushed to the connecting member 50 by the first contacting member 51). The first contacting member 51 is made from an elastic and conductive material, and is a spiral tube, for example. That is, the first contacting member 51 functions as a member for causing the edge ring 30 and the base member 25c to contact stably. The first contacting member 51 may be a member configured to cause the edge ring 30 to contact the stage 11, while the edge ring 30 is caused to physically touch the connecting member 50.

The connecting member 50 is a member having an L-shaped cross section, and consists of a horizontal part 50a and a vertical part 50b. The horizontal part 50a of the connecting member 50 is inserted in the locking part 30a (recess). The horizontal part 50a is inserted in the locking part 30a with a clearance, so that the horizontal part 50a can move in a radial direction when a difference between amounts of thermal expansion (or contraction) of the edge ring 30 and the base member 25c occurs. Thus, because of the locking part 30a, the edge ring 30 is connected with the connecting member 50.

The first contacting member 51 is disposed at a recess formed on a part of the horizontal part 50a inserted in the locking part 30a. Because of the structure, the first contacting member 51 can push the edge ring 30 toward the base member 25c. By the force pushing the edge ring 30 toward the base member 25c, force lifting the edge ring 30 in a height direction is cancelled, and the first contacting member 51 can conduct electricity between the edge ring 30 and the base member 25c while absorbing an effect of thermal expansion. The recess of the horizontal part 50a may be formed such that an opening of the recess is present on a lower surface of the horizontal part 50a, as illustrated in FIG. 4A. Alternatively, the recess of the horizontal part 50a may be formed such that an opening is present on an upper surface of the horizontal part 50a. The first contacting member 51 is provided at the lower surface or the upper surface of the horizontal part 50a, depending on a location of the recess.

The second contacting member 52 is provided at a position lower than the first contacting member 51, and is in contact with a recess provided at a side wall of the base member 25c. The second contacting member 52 is a spiral tube, for example, and is made from an elastic and conductive material. The second contacting member 52 pushes the vertical part 50b of the conductive connecting member 50. The vertical part 50b extends downwards, from a level of the first contacting member 51. Because of the above described structure, electricity is stably conducted between the edge ring 30 and the base member 25c.

As described above, in the contacting structure according to the first embodiment, the connecting member 50 is inserted in the locking part 30a which is the recess formed in the edge ring 30 toward an outer circumference of the edge ring 30, and the first contacting member 51 is provided at a recess formed on a part of the connecting member 50 inserted in the locking part 30a. Because of this structure, force in a height (vertical) direction applied to the edge ring 30 from the first contacting member 51 is cancelled, and the edge ring 30 is prevented from being lifted. Further, in the locking part 30a, as the connecting member 50 is configured to be moved in a radial direction in response to an occurrence of thermal expansion (or contraction), an effect of thermal expansion is reduced. Thus, electricity is conducted with certainty between the edge ring 30 and the base member 25c.

In a case in which conductive material is partly disposed at an edge ring in a circumferential direction, electrical bias occurs. On the other hand, in the present embodiment, as the first contacting member 51 is a ring-shaped member, the first contacting member 51 is disposed at an entire circumference of the edge ring 30. Accordingly, the edge ring 30 is uniformly contacted with the base member 25c in the entire circumference of the first contacting member 51. Thus, the edge ring 30 and the base member 25c are stably maintained at the same electric potential.

As described above, in the present embodiment, force lifting the edge ring 30 in a height direction is cancelled, and electricity is conducted with certainty between the edge ring 30 and the base member 25c while absorbing an effect of thermal expansion. Thus, the edge ring 30 is stably contacted with the base member 25c.

As a result, because DC voltage from the variable DC power source 28 is applied with certainty to the edge ring 30, a sheath above the edge ring 30 can be precisely controlled during plasma processing, occurrence of tilting is suppressed, and uniformity of distribution of an etching rate on a surface improves. As a result, even if the edge ring 30 has abraded to a certain extent, a replacement cycle of the edge ring 30 can be extended by controlling DC voltage applied to the edge ring 30, and productivity is increased.

However, instead of a ring-shaped member, multiple separate arc-shaped members may be used as the first contacting member 51. The second contacting member 52 may also be formed of multiple arc-shaped members (such as arc-shaped members 52a, 52b, and 52c illustrated in FIG. 6B), and each of the arc-shaped members may be disposed separately. The connecting member 50 may also be formed of multiple arc-shaped members. Note that the multiple arc-shaped members forming the second contacting member 52 are not required to be disposed separately, and may be connected with each other. Similarly, the multiple arc-shaped members forming the connecting member 50 are not required to be disposed separately, and may be connected with each other. Alternatively, the second contacting member 52 and the connecting member 50 are not necessarily formed of multiple separate members.

In the first embodiment, by the first contacting member 51 being provided, electricity can be conducted between the edge ring 30 and the base member 25c via the connecting member 50. Thus, the second contacting member 52 is not required to be provided. Also, the second contacting member 52 may not be a conductive member. However, in order that the connecting member 50 is contacted with the base member 25c more stably, it is preferable that the second contacting member 52 is provided.

Modified Example of First Embodiment

Next, the contacting structure of the edge ring 30 and the stage 11 according to the modified example of the first embodiment, which is illustrated in FIG. 4B, will be described. In the following, a difference between the contacting structure according to the modified example and the contacting structure according to the first embodiment is mainly described.

In the modified example of the first embodiment, the connecting member 50 is fixed to the base member 25c with a screw 61. Accordingly, the connecting member 50 is kept in contact with the base member 25c more stably, and the edge ring 30 can be contacted with the base member 25c stably.

In the modified example of the first embodiment, as the screw 61 is disposed such that the screw 61 penetrates an inside of a cylindrical collar 60 provided between the insulator ring 32 and the base member 25c, the screw 61 is less likely to be affected by thermal expansion. The screw 61 is an example of a fixing member for fixing the connecting member 50 to the base member 25c, and the fixing member is not limited to the screw 61.

In the modified example of the first embodiment, by the first contacting member 51 being provided, electricity can be conducted between the edge ring 30 and the base member 25c via the connecting member 50, similar to the first embodiment. Thus, the second contacting member 52 is not required to be provided. Also, the second contacting member 52 may not be a conductive member. However, in order that the connecting member 50 is contacted with the base member 25c more stably, it is preferable that the second contacting member 52 is provided.

Second Embodiment

[Contacting Structure of Edge Ring and Stage]

Next, an example of a contacting structure of the edge ring 30 and the stage 11 according to a second embodiment will be described with reference to FIG. 5. FIG. 5 is a diagram illustrating the example of the contacting structure of the edge ring 30 and the stage 11 according to the second embodiment.

In the contacting structure according to the second embodiment, by the first contacting member 51, a connecting member 53, and the second contacting member 52, the edge ring 30 is contacted with the base member 25c stably.

The connecting member 53 according to the second embodiment is a ring-shaped member, which is made from conductive material such as aluminum, and is inserted in a recess formed at a side surface of the insulator ring 32, which faces a boundary of outer circumferences of the edge ring 30 and the base member 25c.

The contacting structure according to the second embodiment is also designed such that the edge ring 30 is prevented from being lifted by elastic force of the first contacting member 51. Specifically, a recess is formed on an upper end of an inner circumference of the connecting member 53, which faces the outer circumference of the edge ring 30. The first contacting member 51 is disposed at the recess, and pushes the edge ring 30 from the outer circumference while contacting the insulator ring 32 and the connecting member 53. According to the structure, because the first contacting member 51 pushes the edge ring 30 in a radial direction, the edge ring 30 is not lifted by the elastic force of the first contacting member 51.

Also, in the second embodiment, the second contacting member 52 is provided at a position lower than the first contacting member 51, and is in contact with a recess provided at a side wall of the base member 25c. Also, in the second embodiment, the first contacting member 51 is a ring-shaped member, and the first contacting member 51 is disposed at an entire circumference of the edge ring 30. Accordingly, the edge ring 30 is uniformly contacted with the base member 25c in the entire circumference of the first contacting member 51. Thus, the edge ring 30 and the base member 25c are stably maintained at the same electric potential.

However, instead of a ring-shaped member, multiple separate arc-shaped members may be used as the first contacting member 51. The second contacting member 52 may also be formed of multiple arc-shaped members as illustrated in FIG. 6B, and each of the arc-shaped members may be disposed separately. The connecting member 53 may also be formed of multiple arc-shaped members. Note that the multiple arc-shaped members forming the second contacting member 52 are not required to be disposed separately, and may be connected with each other. Similarly, the multiple arc-shaped members forming the connecting member 53 are not required to be disposed separately, and may be connected with each other. Alternatively, the second contacting member 52 and the connecting member 53 are not necessarily formed of multiple separate members.

As described above, the contacting structure according to the second embodiment includes the edge ring 30, the base member 25c, the conductive connecting member 53 provided around the outer circumferences of the edge ring 30 and the base member 25c, the first contacting member 51 provided between the edge ring 30 and the connecting member 53 which is configured to push the edge ring 30 from the outer circumference of the edge ring 30 to a direction away from the connecting member 53, and the second contacting member 52 provided at a position lower than the first contacting member 51, which is in contact with the base member 25c.

According to the structure, a difference of an amount of thermal expansion of the edge ring 30 and an amount of thermal expansion of the base member 25c, which varies depending on process conditions, can be absorbed, without applying force in a height direction to the edge ring 30. Thus, electricity is conducted between the edge ring 30 and the base member 25c with certainty. In the second embodiment, electricity is conducted with certainty between the edge ring 30 and the base member 25c even with a simple structure. That is, the contacting structure according to the second embodiment makes maintenance of the processing apparatus 1 easier.

Note that, in the second embodiment, not only the first contacting member 51 but also the second contacting member 52 are necessary, in order to conduct electricity between the edge ring 30 and the base member 25c.

Third Embodiment

[Contacting Structure of Edge Ring and Stage]

Figure 6A:
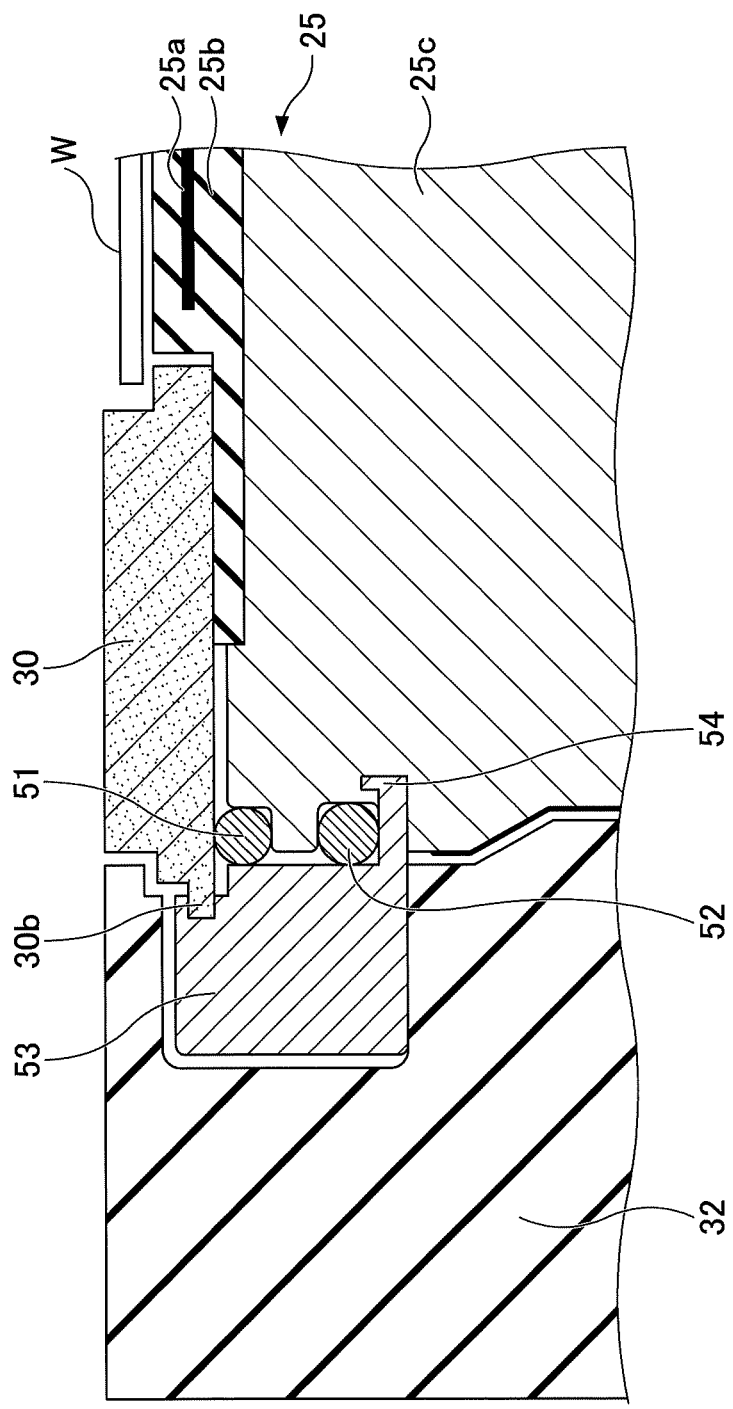
FIG. 6A is a diagram illustrating an example of a contacting structure of the edge ring and the stage according to a third embodiment.

Next, an example of a contacting structure of the edge ring 30 and the stage 11 according to a third embodiment will be described with reference to FIG. 6A. FIG. 6A is a diagram illustrating the example of the contacting structure of the edge ring 30 and the stage 11 according to the third embodiment. FIG. 6B is a diagram illustrating an example of a second contacting member 52, in a case in which the second contacting member 52 is formed of multiple separate members.

As compared with the contacting structure according to the second embodiment, the contacting structure according to the third embodiment is different in that the first contacting member 51 is disposed at a different location, in that an edge ring 30 according to the third embodiment includes a locking part 30b, and in that the contacting structure according to the third embodiment includes a hook portion 54.

The first contacting member 51 according to the third embodiment is provided between the edge ring 30 and the base member 25c, and applies force to the lower surface of the edge ring 30 in a direction away from the base member 25c. The locking part 30b is a projection protruding from a lower end of an outer circumference of the edge ring 30. By the locking part 30b being inserted into a recess formed on an inner side wall of a connecting member 53, the edge ring 30 is anchored to the connecting member 53. The locking part 30b protrudes from the entire outer circumference of the edge ring 30, like a flange.

According to the above mentioned structure, although the first contacting member 51 applies elastic force to the edge ring 30 in a height direction, the edge ring 30 is not lifted by the force of the first contacting member 51. Further, the second contacting member 52 is provided at a position lower than the first contacting member 51, and is in contact with a recess provided at a side wall of the base member 25c. The hook portion 54 protrudes from the connecting member 53, and is embedded in the base member 25c in a horizontal direction such that a part of an upper surface of the hook portion 54 touches a bottom surface of the second contacting member 52. Accordingly, by the elastic second contacting member 52, force in a downward direction is applied to the connecting member 53 via the hook portion 54, and thereby the edge ring 30 is prevented from being lifted.

In the third embodiment also, the first contacting member 51 is a ring-shaped member, and the first contacting member 51 is disposed at an entire circumference of the edge ring 30. Accordingly, the edge ring 30 is uniformly contacted with the base member 25c in the entire circumference of the first contacting member 51. Thus, the edge ring 30 and the base member 25c are stably maintained at the same electric potential. However, instead of a ring-shaped member, multiple separate arc-shaped members may be used as the first contacting member 51.

As illustrated in FIG. 6B, the second contacting member 52 may also be formed of the three separate arc-shaped members 52a, 52b, and 52c. After the arc-shaped members 52a, 52b, and 52c are fitted to the recess in the base member 25c, the arc-shaped members 52a, 52b, and 52c get connected with each other, by using parts for connection such as screws, pins, or other connecting means. The number of arc-shaped members forming the second contacting member 52 is not limited to 3. That is, the second contacting member 52 may be formed of arc-shaped members of numbers other than 3. Alternatively, the second contacting member 52 and the connecting member 53 are not necessarily formed of multiple separate members.

As described above, the contacting structure according to the third embodiment is designed such that the locking part 30b protruding from the outer circumference of the edge ring 30 is formed on the edge ring 30, and that the edge ring 30 is anchored to the connecting member 53 by the locking part 30b being inserted into a recess formed on an inner side wall of a connecting member 53. According to the structure, a difference of an amount of thermal expansion of the edge ring 30 and an amount of thermal expansion of the base member 25c, which varies depending on process conditions, can be absorbed, while cancelling force in a height direction applied to the edge ring 30. Thus, electricity is conducted with certainty between the edge ring 30 and the base member 25c. In the third embodiment, electricity is conducted with certainty between the edge ring 30 and the base member 25c even with a simple structure. That is, the contacting structure according to the second embodiment makes maintenance of the processing apparatus 1 easier.

In the third embodiment, by the first contacting member 51 being provided, electricity can be conducted between the edge ring 30 and the base member 25c via the connecting member 53. Thus, the second contacting member 52 is not required to be provided. However, in order that the connecting member 53 is contacted with the base member 25c more stably, it is preferable that the second contacting member 52 is provided.

Modified Example of Method of Applying DC Voltage

Figure 7:
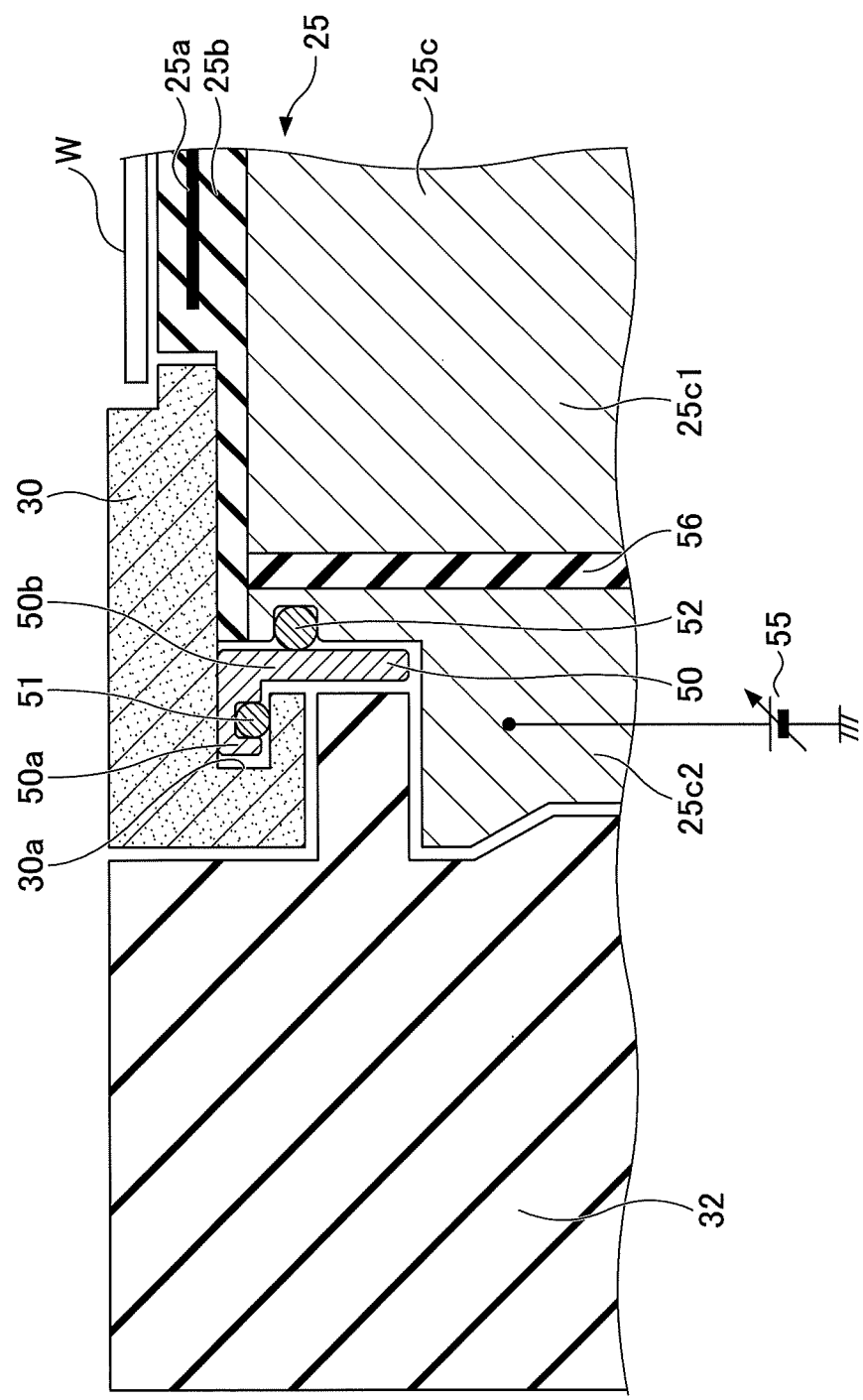
FIG. 7 is a diagram illustrating an example of a method of applying DC voltage according to a modified example of the first, second, or third embodiment.

In the processing apparatus 1 according to the first, second, or third embodiment described above, DC voltage output from the variable DC power source 28 is applied to the edge ring 30 via the electric wire 21b. In the following, a modified example of a method of applying DC voltage to the edge ring 30 will be described with reference to FIG. 7.

In the modified example to be described below, a cylindrical shaped insulating member 56 is disposed in a base member (which corresponds to the base member 25c according to the first to third embodiments) at an inner position relative to the second contacting member 52, such that an inner portion 25c1 of the base member is electrically separated from an outer portion 25c2 of the base member. It is preferable that the insulating member 56 is provided at, but not limited to, the outer portion 25c2 of the base member. The insulating member 56 may be disposed such that the inner portion 25c1 of the base member is electrically separated from the outer portion 25c2 of the base member.

Also, in the modified example, a variable DC power source 55 which is different from the variable DC power source 28 (in FIG. 1) is provided. By the variable DC power source 55, DC voltage can be applied to the edge ring 30. Specifically, the variable DC power source 55 is connected to the outer portion 25c2 of the base member, and applies DC voltage to the outer portion 25c2 independent of the variable DC power source 28 (in FIG. 1). The DC voltage applied to the outer portion 25c2 is also applied to the edge ring 30 via the connecting member 50. According to the structure, as thickness of a sheath can be controlled, a sheath above a wafer W and a sheath above the edge ring 30 can be made to be at the same height during plasma processing. Therefore, distribution of an etching rate on a surface and tilting can be controlled.

The variable DC power source 55 in the modified example is an example of a DC voltage application unit connected to an outer region of the stage 11. A method of applying DC voltage according to the modified example is applicable to all of the first, second, and third embodiments.

Although the processing apparatus has been described in the above embodiments, a processing apparatus according to the present invention is not limited to the above embodiments. Various changes or enhancements can be made hereto within the scope of the present invention. Matters described in the above embodiments may be combined unless inconsistency occurs.

The present invention is applicable not only to a parallel-flat plate type dual-frequency apparatus illustrated in FIG. 1, but also to other types of apparatus, such as a capacitively coupled plasma (CCP) type processing apparatus, an inductively coupled plasma (ICP) type processing apparatus, a processing apparatus using a radial line slot antenna, a helicon wave plasma (HWP) type processing apparatus, an electron cyclotron resonance plasma (ECR) type, or a surface wave plasma processing apparatus.

In this specification, the semiconductor wafer W is referred to as an example of a workpiece. However, the workpiece is not limited to the semiconductor wafer. Examples of the workpiece may include various types of substrates used in an LCD (Liquid Crystal Display) or a FPD (Flat Panel Display), a photomask, a CD substrate, or a printed circuit board.

What is claimed is:

1. A placement apparatus for placing a workpiece in a processing vessel, the placement apparatus comprising:
   a base disposed inside the processing vessel;
   an electrostatic chuck disposed on the base and on which the workpiece can be placed;
   an edge ring disposed on the electrostatic chuck so as to surround a periphery of the workpiece, the edge ring having a contact surface in contact with the electrostatic chuck;
   an electrically conductive connecting member having a horizontal portion and electrically connected, at the horizontal portion, with the edge ring;
   an insulating member separating the base into an inner portion and an outer portion electrically, wherein the outer portion is configured such that direct current voltage is applied to the outer portion;
   a first contacting member being electrically conductive and configured to exert an elastic force; and
   a second contacting member being electrically conductive and configured to exert an elastic force,
   wherein the edge ring has a locking part on an outer circumferential side situated further out than the contact surface of the edge ring in contact with the electrostatic chuck, the locking part being a recess formed in the edge ring, the recess facing a lateral surface of the electrostatic chuck and housing the horizontal portion,
   wherein the horizontal portion has a first recess in an upper surface or lower surface thereof, the first contacting member being disposed in the first recess, wherein the edge ring and the horizontal portion are electrically connected to each other via the first contacting member, wherein the electrically conductive connecting member has a vertical portion electrically connected to the horizontal portion and extending downward, and wherein the vertical portion and the base are electrically connected to each other via the contacting member.

2. A processing apparatus comprising:

a processing vessel including a processing space for applying a process to a workpiece;

a base disposed inside the processing vessel;

an electrostatic chuck disposed on the base and on which the workpiece can be placed;

an edge ring disposed on the electrostatic chuck so as to surround a periphery of the workpiece, the edge ring having a contact surface in contact with the electrostatic chuck;

an electrically conductive connecting member having a horizontal portion and electrically connected, at the horizontal portion, with the edge ring;

a first contacting member being electrically conductive and configured to exert an elastic force; and a second contacting member being electrically conductive and configured to exert an elastic force, wherein the edge ring has a locking part on an outer circumferential side situated further out than the contact surface of the edge ring in contact with the electrostatic chuck, the locking part being a recess formed in the edge ring, the recess facing a lateral surface of the electrostatic chuck and housing the horizontal portion, wherein the horizontal portion has a first recess in an upper surface or lower surface thereof, the first contacting member being disposed in the first recess, wherein the edge ring and the horizontal portion are electrically connected to each other via the first contacting member, wherein the electrically conductive connecting member has a vertical portion electrically connected to the horizontal portion and extending downward, and wherein the vertical portion and the base are electrically connected to each other via the second contacting member.

3. A placement apparatus for placing a workpiece in a processing vessel, the placement apparatus comprising:

a base disposed inside the processing vessel;

an electrostatic chuck disposed on the base and on which the workpiece can be placed;

an edge ring disposed on the electrostatic chuck so as to surround a periphery of the workpiece, the edge ring having a contact surface in contact with the electrostatic chuck;

an electrically conductive connecting member having a horizontal portion and electrically connected, at the horizontal portion, with the edge ring;

a first contacting member being electrically conductive and configured to exert an elastic force; and a second contacting member being electrically conductive and configured to exert an elastic force, wherein the edge ring has a locking part on an outer circumferential side situated further out than the contact surface of the edge ring in contact with the electrostatic chuck, the locking part being a recess formed in the edge ring, the recess facing a lateral surface of the electrostatic chuck and housing the horizontal portion, wherein the horizontal portion has a first recess in an upper surface or lower surface thereof, the first contacting member being disposed in the first recess, wherein the edge ring and the horizontal portion are electrically connected to each other via the first contacting member, wherein the electrically conductive connecting member has a vertical portion electrically connected to the horizontal portion and extending downward, and wherein the vertical portion and the base are electrically connected to each other via the second contacting member.

4. The placement apparatus according to claim 3, wherein the first contacting member is a ring-shaped member and is provided at an entire circumference of the edge ring.

5. The placement apparatus according to claim 3, wherein the second contacting member is formed of a plurality of members, each of the plurality of members being provided separately.

6. The placement apparatus according to claim 3, wherein the second contacting member is housed in a second recess formed in a lateral surface of the base.

7. The placement apparatus according to claim 6, the locking part is recessed in a direction toward an outer circumference of the edge ring.

8. The placement apparatus according to claim 7, wherein the locking part is a recess formed along an entire outer circumference of the edge ring and recessed in a direction toward an outer circumference of the edge ring.

9. The placement apparatus according to claim 6, wherein the electrically conductive connecting member is fixed to the base with a fixing member attached to the vertical portion.

\* \* \* \* \*